(12) United States Patent
Wells

(10) Patent No.: US 7,961,112 B2
(45) Date of Patent: Jun. 14, 2011

(54) CONTINUOUS CONDITION MONITORING OF TRANSFORMERS

(75) Inventor: Charles H. Wells, Emerald Hills, CA (US)

(73) Assignee: OSIsoft, Inc., San Leandro, CA (US)

( * ) Notice: Subject to any disclaimer, the term of this patent is extended or adjusted under 35 U.S.C. 154(b) by 0 days.

(21) Appl. No.: 12/657,505

(22) Filed: Jan. 22, 2010

(65) Prior Publication Data

US 2010/0188240 A1    Jul. 29, 2010

Related U.S. Application Data

(60) Provisional application No. 61/206,398, filed on Jan. 29, 2009.

(51) Int. Cl.
     *G08B 21/00*    (2006.01)
(52) U.S. Cl. ........ 340/646; 340/635; 340/660; 340/664; 324/546; 324/547
(58) Field of Classification Search .................. 340/635, 340/646–654, 657, 660–664, 511; 324/430, 324/525, 526, 547
See application file for complete search history.

(56) References Cited

U.S. PATENT DOCUMENTS

| | | | | |
|---|---|---|---|---|
| 3,723,813 A * | 3/1973 | Allen | .............................. | 361/45 |
| 4,333,119 A | 6/1982 | Schoenmeyr | | |
| 4,857,856 A | 8/1989 | Coleman et al. | | |
| 5,091,690 A * | 2/1992 | D'Antonio et al. | ........... | 324/107 |
| 5,276,402 A * | 1/1994 | Schucht | ........................ | 324/726 |
| 6,175,810 B1 | 1/2001 | Jurisch | | |
| 6,415,244 B1 * | 7/2002 | Dickens et al. | ............... | 702/187 |
| 6,633,166 B1 * | 10/2003 | Kaiser | ........................... | 324/522 |
| 6,933,714 B2 * | 8/2005 | Fasshauer et al. | ......... | 324/76.21 |
| 6,987,390 B2 | 1/2006 | Süss et al. | | |
| 7,490,013 B2 | 2/2009 | Wells | | |
| 7,683,795 B2 * | 3/2010 | Bjorn | ........................... | 340/650 |
| 7,693,608 B2 * | 4/2010 | Nasle | ............................ | 700/286 |
| 2004/0164745 A1 | 8/2004 | Ryder | | |
| 2007/0052426 A1 * | 3/2007 | Wells et al. | ................... | 324/547 |

* cited by examiner

*Primary Examiner* — Benjamin C Lee
*Assistant Examiner* — Peter C Mehravari
(74) *Attorney, Agent, or Firm* — Lumen Patent Firm

(57) ABSTRACT

A device and method for monitoring the condition of an electrical power transformer in an electrical power grid synchronously measures current and voltage data at both a high voltage side of the transformer and a low-voltage side of the transformer and computes from this measured data corresponding transformer impedance data. These measurements and computations are repeated continuously in real time at a rates up to 30 Hz to provide a sequence of real-time transformer impedance data. An alarm signal is generated if a mean of the sequence of real-time transformer impedance data changes significantly.

14 Claims, 5 Drawing Sheets

Fig. 2

100
Transformer monitoring device

200
Power supply

202
1500 Wh uninterruptible power supply

204
Computer with memory and storage media

206
Arbiter

208
Arbiter

210
Fiberoptic router

212
Field terminations (6 voltage, 6 current)

*Fig. 4A*
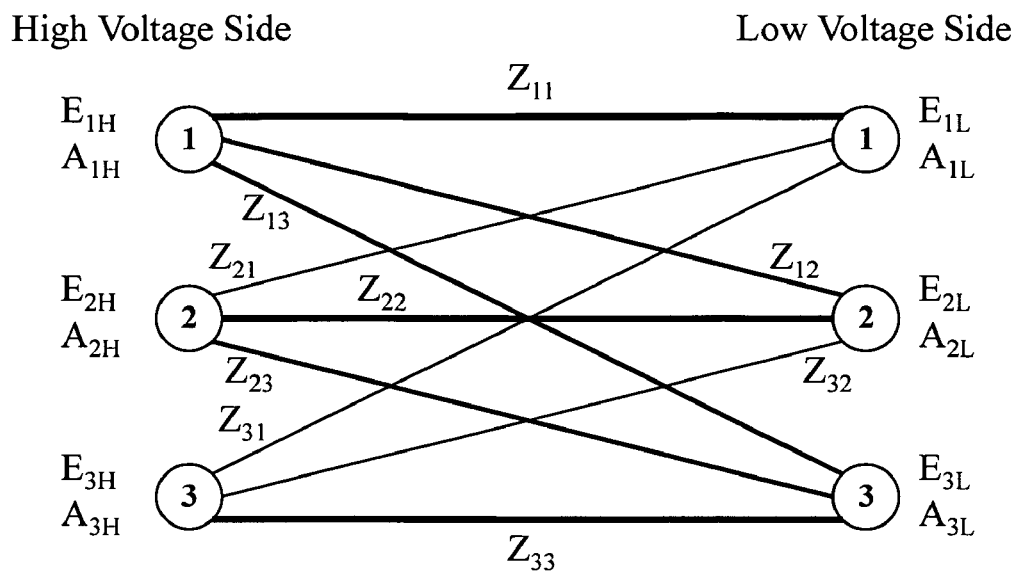
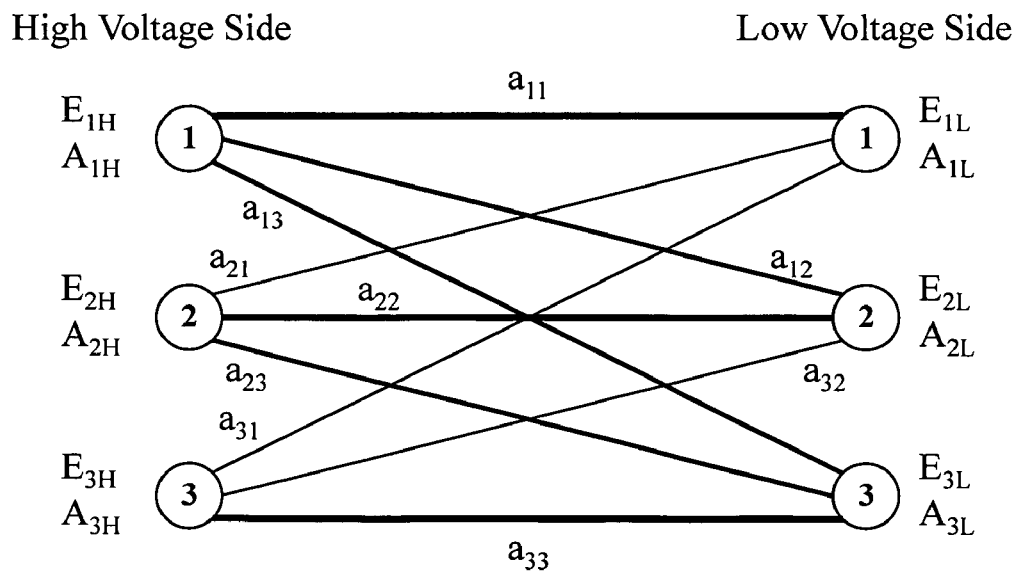
*Fig. 4B*

CONTINUOUS CONDITION MONITORING OF TRANSFORMERS

CROSS-REFERENCE TO RELATED APPLICATIONS

This application claims priority from U.S. Provisional Patent Application 61/206,398 filed Jan. 29, 2009, which is incorporated herein by reference.

FIELD OF THE INVENTION

The present invention relates generally to electrical power grids and the transformation of power from one voltage to another. More specifically, it relates to devices and methods for monitoring the condition of electrical power transformers in a grid.

BACKGROUND OF THE INVENTION

Electrical power grids include power generation stations, high-voltage transmission grids, and lower-voltage distribution grids. Step-up transformers at the generating stations provide high-voltage (over 100 kV) power to the transmission grid for efficient long-distance power transmission. Step-down transformers at distribution substations convert the high-voltage power to lower-voltage power that is distributed over shorter distances for local use. These transformers are associated with loads such as buildings, commercial and industrial enterprises. Because transformers are a key component of electrical power grids, transformer malfunction and failure is a serious concern. Accordingly, there is a need for techniques and devices for monitoring power transformer condition. Moreover, because of significant expenses are required for aging power transformer replacements, there is a need for power transformer diagnostics to assist in the increase in power transformer lifetimes.

SUMMARY OF THE INVENTION

In one aspect, the present invention provides a method for monitoring the condition of an electrical power transformer. The method includes measuring current and voltage data at terminals of the transformer, and computing from the measured current and voltage data corresponding transformer impedance data. The measured current and voltage data include both current and voltage data measured at terminals on a high voltage side of the transformer and current and voltage data measured at terminals on a low-voltage side of the transformer. The measurement of current and voltage data and the computation of corresponding transformer impedance data are repeated continuously in real time to provide a temporal sequence of real-time transformer impedance data that include the computed transformer impedance data. From the temporal sequence of real-time transformer impedance data, a moving average of transformer impedance is computed, and an alarm signal is generated if recent transformer impedance values in the temporal sequence depart from the calculated moving average by a predetermined amount.

The measuring is performed while the transformer is in service and the measured current and voltage data do not contain injected test signals. The current and voltage data preferably include 6 high-side phasor values and 6 low-side phasor values measured from three high-voltage terminals of the transformer and three low-voltage terminals of the transformer, respectively. The computed impedance data preferably include 9 impedances representing impedances between three high-voltage terminals of the transformer and three low-voltage terminals of the transformer.

The measured current data and voltage data are measured synchronously, i.e., preferably to within 1 microsecond of each other. The measurements are preferably repeated at a rate of at least 30 Hz and the computation of corresponding impedances is preferably repeated at a rate of at least 1 Hz. The moving average of transformer impedance is preferably calculated within a time window of at least 1 second.

In one implementation, an alarm is triggered if a most recent transformer impedance value differs from the calculated moving average by more than three standard deviations. In another implementation, an alarm is triggered if multiple consecutive recent transformer impedance values differ from the calculated moving average by more than two standard deviations. In yet another implementation, an alarm is triggered if multiple consecutive recent transformer impedance values are all greater than the calculated moving average. These alternative triggers may also be used in combination with each other.

The method may also include computing a load duration curve, and detecting a duration of an abnormal load. In addition, the method may include computing a fast Fourier transform of secondary loads.

BRIEF DESCRIPTION OF THE DRAWINGS

FIG. 2 is a block diagram of basic components of a transformer monitoring device 100 according to an embodiment of the invention.

FIGS. 4A and 4B are schematic diagrams illustrating nine impedances and nine currents, respectively, between the six terminals of a substation transformer according to an embodiment of the invention

DETAILED DESCRIPTION

Transformer monitoring systems can help improve reliable, efficient, and cost-effective operation of electrical grids. Automatic evaluation of on-line monitoring data can predict the onset of transformer stresses and failures. In addition, systems that include suitable diagnostic analysis can also assist in the detection of stresses on the transformer that can affect its lifetime and assist in performing condition-based maintenance.

Figure 1:
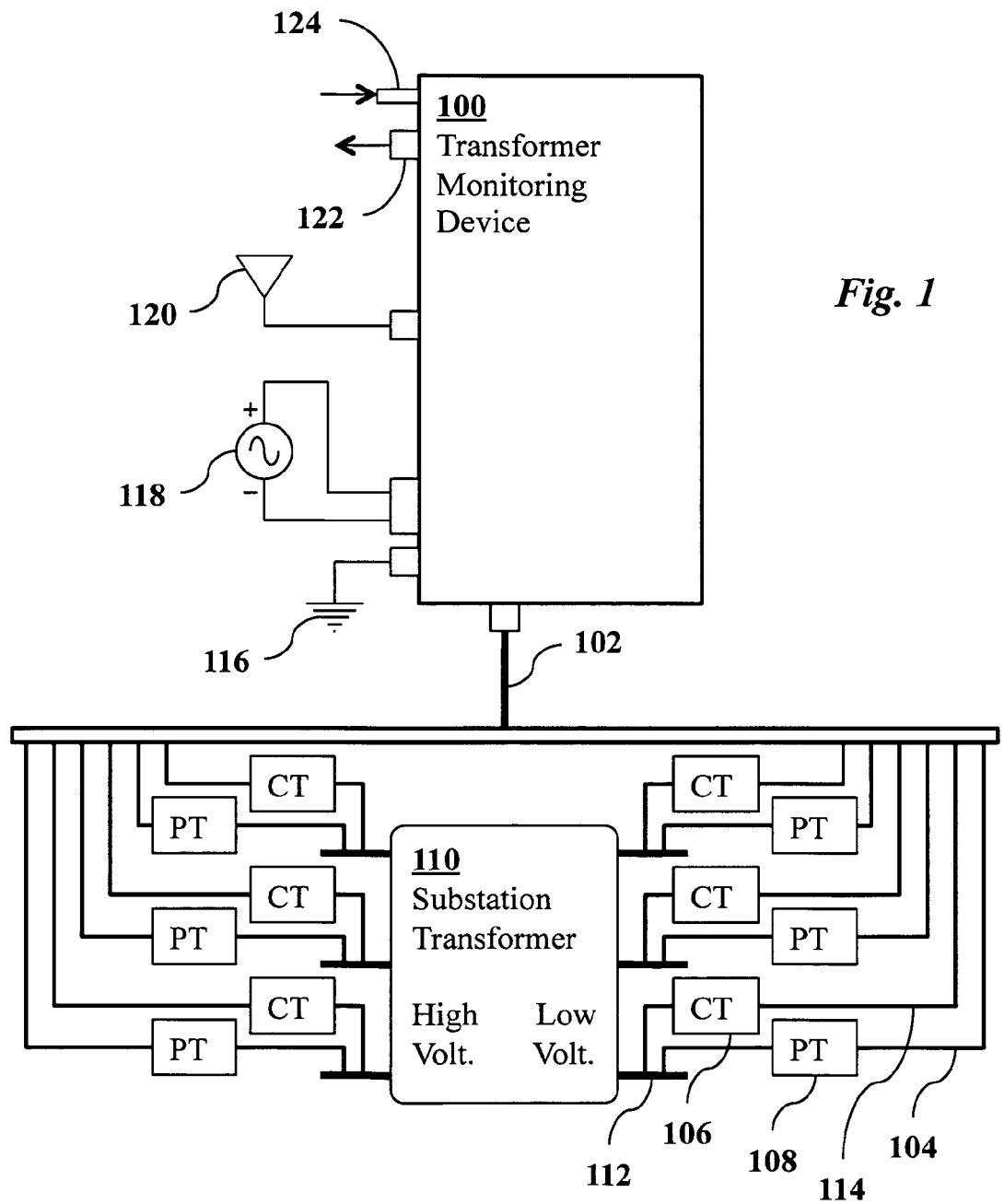
FIG. 1 is a schematic diagram of a continuous transformer condition monitoring system according to an embodiment of the invention.

FIG. 1 is a schematic diagram of a system according to an embodiment of the invention which may be used to implement a technique for the efficient, continuous, real-time monitoring of a transformer condition using on-line impedance monitoring. The techniques may also identify and/or predict transformer malfunction or failure. A transformer condition monitoring device 100 is connected using a 36 pin Mil C 5015 connector to a prefabricated armored flex cable 102 for receiving signals from a substation transformer 110.

At the transformer, current transformer (CT) and potential transformer (PT) signals at three low-voltage terminals and three high-voltage terminals are detected using 12 shielded coaxial cables connected in pairs to the six terminals, with shields terminated inside data acquisition units to TCM ground. For example, terminal 112 is connected to CT acquisition unit 106 and PT acquisition unit 108. Real-time signals are communicated to the monitoring device 100 for storage and analysis via the prefabricated armored flex cable 102 connected to the 36 pin Mil C 5015 connector.

Transformer monitoring device 100 also has connections to ground 116, to 110 V AC power at 30 Amps 118, and to a GPS antenna 120. It also has data network port 122 (e.g., fiber optic or Cat5) and air intake port 124.

FIG. 2 is a block diagram of the basic components of transformer monitoring device 100. It includes a 1500 W power supply 200, 6 voltage terminations and 6 current terminations 212, fiber optic router 210, 1133 a arbiters 206 and 208, 1500 Wh UPS 202, and an industrial PC 204 with 4 GB RAM, 80 GB hard drive, running two 37.118 interfaces and two 1344 interfaces, and having an optional IEC 61850 server. Field terminations 212 receive 6 voltage signals and 6 corresponding current signals from the six corresponding terminals of the substation transformer via the armored flex cable. Arbiters 206 and 208 are configured to make real time phasor measurements from the signals. Computer 204 analyzes, stores, and processes the measurements. Fiberoptic router is used to communicate alarms and other data from the device.

Figure 3:
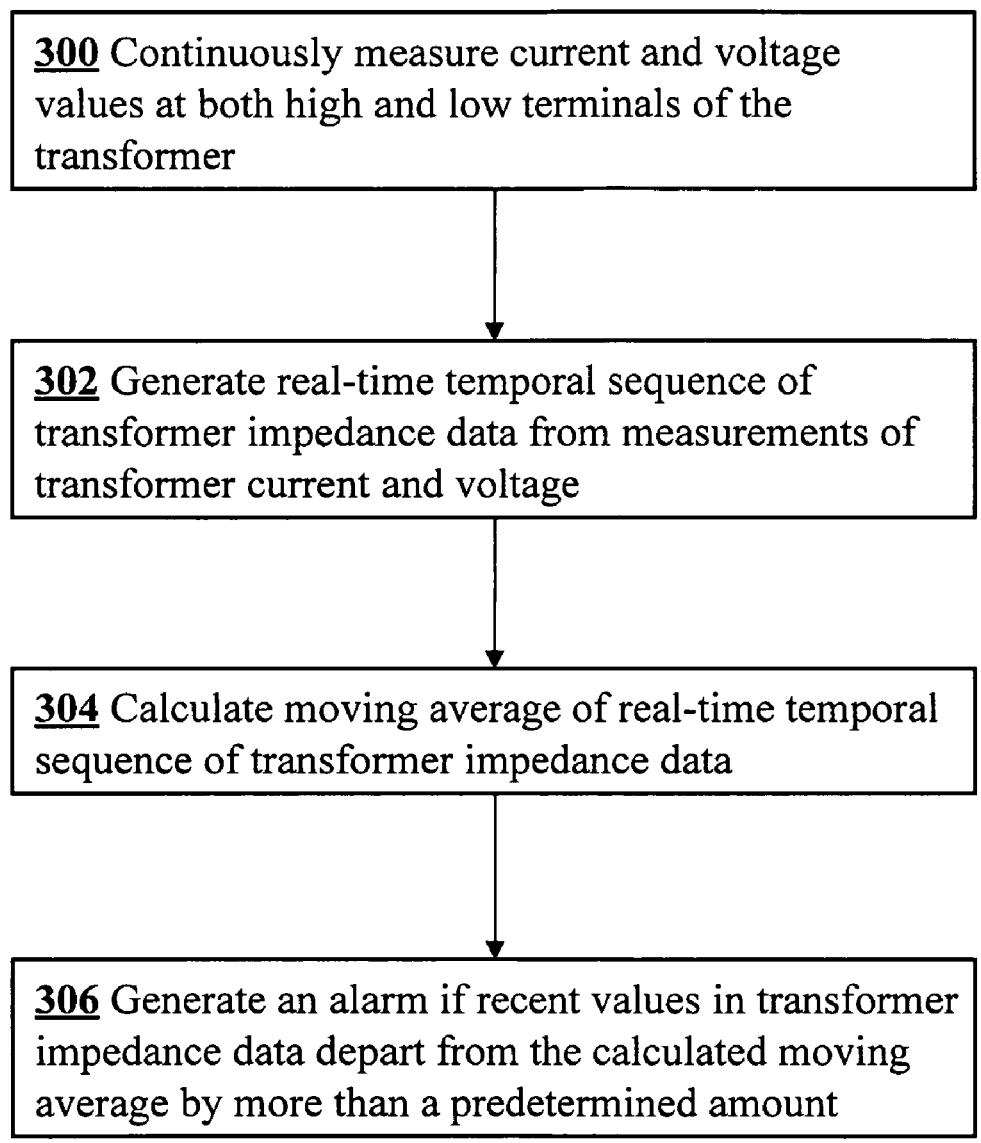
FIG. 3 illustrates operational steps of a transformer monitoring method according to an embodiment of the invention.

The operation of transformer monitoring device 100 is illustrated in FIG. 3. In step 300 current and voltage values at both high and low terminals of the substation transformer are continuously measured while the substation transformer is operating. In a preferred embodiment, precise phasor values of the electrical power signals are measured at synchronized instants of time by PMUs that are implemented by arbiters. Synchronized measurements, in the present context, is defined as meaning measurements made within 1 microsecond of each other. Preferably, a total of 12 complex-valued phasor measurements are collected at a rate of at least 30 Hz, where each complex phasor value is represented in rectilinear form by its real and imaginary parts. Thus, PMUs measure three synchronized voltage and current phasors on each side of the transformer. This is a total of 12 phasors. Each phasor has real and imaginary component, so there are 24 real-valued quantities measured. Note that magnitude and angle are used. The phasors are in rectilinear coordinates. These phasor values measured continuously at a rate of at least 30 Hz form a real-time stream of on-line transformer data.

In step 302, complex impedances are computed in real time from the real time measurement data from the PMUs. More specifically, nine complex-valued impedances are computed in real time from the measurement data, and a corresponding nine complex-valued currents may also be computed in real time. It is typically not necessary to calculate new impedance values at the same rate as the phasor values are measured. In the preferred embodiment, impedance values are calculated to nearest microsecond with values reported from the top of the second. Thus, a real-time temporal sequence of transformer impedance data is produced from the stream of transformer current and voltage signals. In the preferred embodiment, the impedance values are calculated at a rate of at least 1 Hz.

The calculated impedance values will normally change over time and provide sufficient conditions to alarm when changes in the transformer condition become significant. The recommended alarming function is the PI SQC package. The mean of the impedance values, e.g., a moving average taken over a recent time interval window, should have a constant or relatively stable value. Thus, in step 304 a moving average of the real-time temporal sequence of impedance values is calculated, preferably using a time window of at least 1 second.

In step 306 an alarm signal is generated if recent values of the impedance data depart from the moving average by more than a predetermined amount. For example, in one embodiment, an alarm is triggered if a most recent transformer impedance value differs from the calculated moving average by more than three standard deviations. In another implementation, an alarm is triggered if multiple consecutive recent transformer impedance values differ from the calculated moving average by more than two standard deviations. In yet another implementation, an alarm is triggered if multiple consecutive recent transformer impedance values are all greater than the calculated moving average. Also, if recent impedances exceed predetermined threshold values, then an alarm signal may be generated. In another implementation, if significant variation of the mean of the impedance values is detected, then an alarm signal can be generated. These various triggers described above may be used separately or in combination with each other. The generated alarm signals may be transmitted to a centralized grid management system, be displayed to a human operator, or used to perform automatic system adjustments.

FIGS. 4A and 4B are schematic diagrams illustrating the six terminals of the substation transformer and the nine impedances and nine currents between them. As shown in FIG. 4A, the complex-valued transformer impedances are denoted $Z_{ij}$ where the index i takes the values 1, 2, 3 representing the three high voltage terminals, and the index j takes the values 1, 2, 3 representing the three low voltage terminals. Similarly, as shown in FIG. 4B, the complex-valued currents inside the transformer are denoted $a_{ij}$ where the index i takes the values 1, 2, 3 representing the three high voltage terminals, and the index j takes the values 1, 2, 3 representing the three low voltage terminals. Thus, the impedance between high voltage terminal i and low voltage terminal j is $Z_{ij}$, while the current between high voltage terminal i and low voltage terminal j is $a_{ij}$. Normally the impedance would be infinite for the cross connections since they should be open circuits. However in the case of shorts, these would be measurable quantities. There are also magnetically induced currents flowing inside the transformer.

The impedances $Z_{ij}$ and internal currents $a_{ij}$ may be calculated from the voltage and external current values measured at the terminals. The measured high and low voltage phasor values are denoted $E_{kH}$ and $E_{kL}$, respectively, where k ranges over 1, 2, 3 representing the three terminals on the high and low sides. Similarly, the measured high and low current phasor values are denoted $A_{kH}$ and $A_{kL}$, respectively, where k ranges over 1, 2, 3 representing the three terminals on the high and low sides. The basic relations between the impedances, currents and voltages The equations relating these quantities are as follows. There are nine voltage equations $$E_{iH} - E_{jL} = Z_{ij} a_{ij} \text{ for } i=1, 2, 3 \text{ and } j=1, 2, 3$$

and six current equations $$A_{iH} = a_{i1} + a_{i2} + a_{i3} \text{ for } i=1, 2, 3$$

and $$A_{jL} = a_{1j} + a_{2j} + a_{3j} \text{ for } j=1, 2, 3.$$

These equations combined with 12 complex measurements of the synchronized voltage and current provide, in theory, the independent measurements required to solve for the 18 unknown variables (nine complex current and nine complex impedances). The challenge is to find a practical solution that is feasible in real time. A brute-force principal component analysis would introduce considerable computational complexity. Accordingly, embodiments of the present invention employ the following simple technique. We begin by assuming that the cross impedances are zero, i.e., $Z_{ij}=0$ for $i \neq j$. We solve for three impedances $$E_{iH}-E_{iL}=Z_{ii}(A_{iH}-A_{iL}) \text{ for } i=1, 2, 3$$

or, equivalently, $$\Delta E_i = Z_i \Delta A_i \text{ for } i=1, 2, 3$$

where $\Delta E_i = E_{iH}-E_{iL}$, $Z_i = Z_{ii}$ and $\Delta A_i = A_{iH}-A_{iL}$, for $i=1, 2, 3$.

Because each of these equations is independent of the others, each can be solved algebraically as follows $$Z_i = \Delta E_i / \Delta A_i \text{ for } i=1, 2, 3.$$

Now, since each variable above is complex-valued, we calculate the real and imaginary (reactive) parts of the impedance as follows:

$$Re(Z_i)=[Re(\Delta E_i)Re(\Delta A_i)+Im(\Delta E_i)Im(\Delta A_i)]/[Re(\Delta A_i)^2+Im(\Delta A_i)^2],$$

$$Im(Z_i)=[Im(\Delta E_i)Re(\Delta A_i)-Re(\Delta E_i)Im(\Delta A_i)]/[Re(\Delta A_i)^2+Im(\Delta A_i)^2].$$

Thus, this approach provides a computationally efficient technique to compute the complex impedance at a given instant from the measured voltage and current values.

In addition to generating alarms based on the behavior of the impedance values, various other conditions may be detected and used to trigger alarms, and these may be used in combination with other alarms. In some embodiments, alarms can be set for negative and zero sequence current and voltage values, as well as for flicker. In some embodiments, the harmonics in voltage and current can be used to detect the condition of the transformer, e.g., as described in US Patent Publication 2007/0052426, which is incorporated herein by reference. For example, the method may include computing a fast Fourier transform of secondary loads. The $2^{nd}$, $5^{th}$ and $7^{th}$ harmonics of current are normally associated with geo-magnetically induced currents. The $3^{rd}$ and all other odd harmonics are associated with switching power supplies and is common in buildings with many computers. The odd harmonics in particular are primarily due to switching power supplies associated with modern computers. This was not a significant problem 25 years ago, but now is common in commercial and industrial buildings. Also these harmonics are associated with the harmonics generate from variable frequency motor drives used in industry. Thus, there can be an automatically alarm on high harmonic currents. These normally appear on the low side of the transformer and can be the cause of excessive heating of the transformer. Especially the $3^{rd}$ harmonic can cause as much as 8 percent loss of energy in the form of heat. If the $3^{rd}$ harmonic is excessive the system will form alarms and customer can make the decision to add harmonic suppression to the system. Generally, high harmonic currents (especially the 3rd harmonic) can generate an alarm. This is the high SQC alarm, basically any value more than 3 sigma above the mean value. The mean is automatically computed over a moving window of data. This is standard in the PI SQC package. The preferred method of generating alarms is using SQC monitoring functions and applying standard methods of determining if a variable is under control to the teachings of the present invention.

Losses may also be computed in real time, and an alarm signal generated for 2, 5, and 7 harmonic excursions. An alarm may also be generated for frequency excursions. The grid stability can also be monitored (e.g., as described in U.S. Pat. No. 7,490,013, which is incorporated herein by reference), and preparations made for power islanding if there is a danger of grid collapse.

Figure 5:
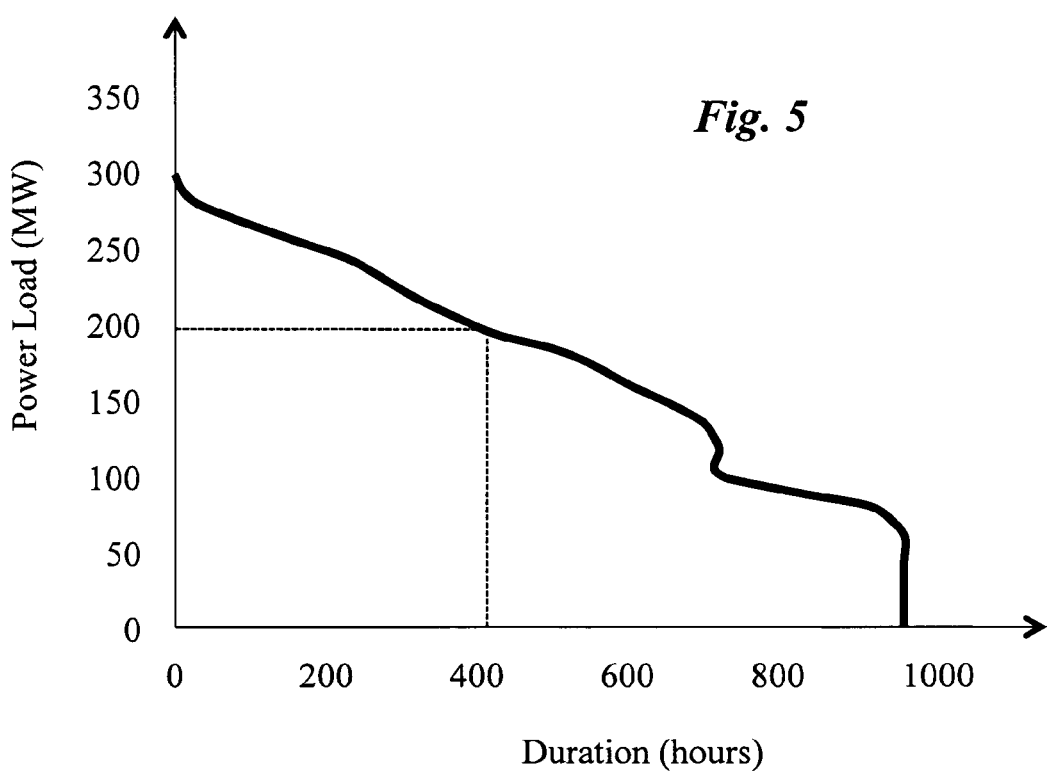
FIG. 5 is a graph of a load duration curve which shows transformer power load versus duration of load according to an embodiment of the invention.

Embodiments of the present invention may also include computing real time load duration curves while the transformer is online. These curves are important in assessing the health of a transformer. A load duration curve, as shown in FIG. 5, is a graph of to transformer power load versus duration of load. Each point on the curve indicates the number of hours that the transformer load was greater than a specified power level. For example, the load duration curve in FIG. 5 indicates that the load was greater than 200 MW for about 400 hours, the load was never greater than 300 MW and it as greater than 0 MW for about 950 hours.

Transformer overloading is common in the industry. A short term overload will generally not cause a catastrophic failure, but will shorten the life of the transformer. There are standard equations that describe how to compute the degradation in expected lifetime. These calculations use load duration curves to compute this degradation in service life. In embodiments of the present invention, load duration curves are computed using historical data in real time while the transformer is on-line. These curves can be computed in real time using standard histogram data analysis tools. Preferably, the load duration curve is computed using historical data extending over the entire lifetime of the transformer. In one embodiment, a load duration curve is recomputed approximately each hour. The load duration curve may be displayed to a human or automatically processed and analyzed. For example, the method may also include detecting from the load duration curve a duration of an abnormal load. In one embodiment, an abnormal load is detected by calculating a pointwise difference between a current load duration and a historical baseline duration curve for each duration along the time axis, and detecting a peak in the calculated difference curve. For example, if the magnitude of the peak is more than twice that of the baseline, then an alarm is triggered.

The invention claimed is:

1. A method for monitoring the condition of an electrical power transformer, the method comprising:
   a) measuring current and voltage data at terminals of the transformer, wherein the current and voltage data comprise both current and voltage data measured at terminals on a high voltage side of the transformer and current and voltage data measured at terminals on a low-voltage side of the transformer, wherein the measured current and voltage data do not contain injected test signals;
   b) computing from the measured current and voltage data corresponding transformer impedance data by i) calculating an initial solution by setting six cross impedances to zero and solving for three impedances from the measured current and voltage data; and ii) calculating nine complex impedances from the initial solution;
   c) repeating (a) and (b) continuously in real time to provide a temporal sequence of real-time transformer impedance data comprising the corresponding transformer impedance data; and
   d) calculating from the temporal sequence of real-time transformer impedance data a moving average of transformer impedance; and
   e) generating an alarm signal if recent transformer impedance values in the temporal sequence depart from the calculated moving average by a predetermined amount.

2. The method of claim 1 wherein the measuring is performed while the transformer is in service.

3. The method of claim 1 wherein the current and voltage data comprise 6 high-side phasor values and 6 low-side phasor values measured from three high-voltage terminals and three low-voltage terminals, respectively.

4. The method of claim 1 wherein the current and voltage data comprise real and imaginary components measured at each of the terminals.

5. The method of claim 1 wherein the corresponding impedance data comprises 9 impedances representing impedances between three high-voltage terminals and three low-voltage terminals.

6. The method of claim 1 wherein the measured current and voltage data are measured synchronously.

7. The method of claim 1 wherein the measured current and voltage data are measured synchronously to within 1 microsecond.

8. The method of claim 1 wherein step (a) is repeated at a rate of at least 30 Hz and step (b) is repeated at a rate of at least 1 Hz.

9. The method of claim 1 wherein the moving average is calculated within a time window of at least 1 second.

10. The method of claim 1 wherein the generating the alarm signal comprises triggering an alarm if a most recent transformer impedance values differ from the calculated moving average by more than three standard deviations.

11. The method of claim 1 wherein the generating the alarm signal comprises triggering an alarm if multiple consecutive recent transformer impedance values differ from the calculated moving average, by more than two standard deviations.

12. The method of claim 1 wherein the generating the alarm signal comprises triggering an alarm if multiple consecutive recent transformer impedance values are all greater than the calculated moving average.

13. The method of claim 1 further comprising computing a load duration curve, and detecting a duration of an abnormal load.

14. The method of claim 1 further comprising computing a fast Fourier transform of secondary loads.

* * * * *